(12) United States Patent
Ikeda

(10) Patent No.: US 9,679,880 B2
(45) Date of Patent: Jun. 13, 2017

(54) CASCODE POWER TRANSISTORS

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 52 days.

(21) Appl. No.: 14/690,637

(22) Filed: Apr. 20, 2015

(65) Prior Publication Data

US 2016/0005725 A1    Jan. 7, 2016

(30) Foreign Application Priority Data

Jul. 7, 2014   (JP) ................. 2014-140040

(51) Int. Cl.
*H01L 25/18*  (2006.01)
*H01L 23/00*  (2006.01)
(Continued)

(52) U.S. Cl.
CPC .............. *H01L 25/18* (2013.01); *H01L 24/49* (2013.01); *H03K 17/08128* (2013.01);
(Continued)

(58) Field of Classification Search
CPC .............. H01L 25/18; H01L 24/49; H01L 2924/13064; H01L 2924/12032; H01L 2924/12035; H01L 2924/1205; H01L 2224/4917; H01L 2224/45124; H01L 2224/45147; H03K 17/08128; H03K 17/163; H03K 17/6871; H03K 17/74; H03K 2017/6875

See application file for complete search history.

(56) References Cited

U.S. PATENT DOCUMENTS

| | | | |
|---|---|---|---|
| 4,945,266 A | 7/1990 | Mori | |
| 7,872,888 B2* | 1/2011 | Kuzumaki | H02M 1/096 363/132 |
| 8,228,113 B2* | 7/2012 | Domes | H01L 24/49 327/427 |
| 8,847,235 B2* | 9/2014 | Rose | H03K 17/08122 257/76 |
| 9,142,544 B2* | 9/2015 | Ikeda | H01L 27/0255 |
| 2008/0048806 A1 | 2/2008 | Maier et al. | |
| 2012/0241756 A1 | 9/2012 | Zhang et al. | |
| 2012/0280271 A1 | 11/2012 | Ichikawa | |

(Continued)

FOREIGN PATENT DOCUMENTS

| | | |
|---|---|---|
| EP | 2 693 639 A1 | 2/2014 |
| JP | 01-133413 | 5/1989 |

(Continued)

OTHER PUBLICATIONS

Extended European Search Report issued Nov. 18, 2015 in Patent Application No. 15164512.4.

*Primary Examiner* — Hai L Nguyen
(74) *Attorney, Agent, or Firm* — Oblon, McClelland, Maier & Neustadt, L.L.P.

(57) ABSTRACT

A semiconductor device according to an embodiment includes a normally off transistor having a first source, a first drain, a first gate connected to a common gate terminal, and a body diode, a normally on transistor having a second source connected to the first drain, a second drain, and a second gate, a capacitor provided between the common gate terminal and the second gate, a first diode having a first anode connected to between the capacitor and the second gate and a first cathode connected to the first source, and a second diode having a second anode connected to the first source and a second cathode connected to the second drain.

12 Claims, 13 Drawing Sheets

(51) Int. Cl.
*H03K 17/0812* (2006.01)
*H03K 17/16* (2006.01)
*H03K 17/687* (2006.01)
*H03K 17/74* (2006.01)

(52) U.S. Cl.
CPC ....... *H03K 17/163* (2013.01); *H03K 17/6871* (2013.01); *H03K 17/74* (2013.01); *H01L 24/45* (2013.01); *H01L 2224/45124* (2013.01); *H01L 2224/45147* (2013.01); *H01L 2224/4917* (2013.01); *H01L 2924/1205* (2013.01); *H01L 2924/12032* (2013.01); *H01L 2924/12035* (2013.01); *H01L 2924/13064* (2013.01); *H01L 2924/13091* (2013.01); *H03K 2017/6875* (2013.01)

(56) References Cited

U.S. PATENT DOCUMENTS

| | | | |
|---|---|---|---|
| 2014/0027785 A1 | 1/2014 | Rose | |
| 2014/0284662 A1 | 9/2014 | Ikeda | |

FOREIGN PATENT DOCUMENTS

| | | |
|---|---|---|
| JP | 04-44444 | 7/1992 |
| JP | 2012-212875 | 11/2012 |
| JP | 2012-235378 | 11/2012 |
| JP | 2014-187726 | 10/2014 |
| WO | WO 00/33380 A1 | 6/2000 |

\* cited by examiner

CASCODE POWER TRANSISTORS

CROSS-REFERENCE TO RELATED APPLICATION

This application is based upon and claims the benefit of priority from Japanese Patent Application No. 2014-140040, filed on Jul. 7, 2014, the entire contents of which are incorporated herein by reference.

FIELD

Embodiments described herein relate generally to a semiconductor device

BACKGROUND

Semiconductors of the group III nitrides, for example, GaN (gallium nitride) based semiconductors are expected as the material of next-generation power semiconductor devices. Compared with Si (silicon), GaN based semiconductor devices have a wider band gap and can realize, compared with semiconductor devices of Si, higher breakdown voltages and lower losses.

An HEMT (High Electron Mobility Transistor) structure using a two-dimensional electron gas (2DEG) as a carrier is generally applied to GaN based transistors. Ordinary HEMT becomes a normally on transistor that allows conduction without a voltage being applied to the gate. Thus, a problem is posed that it is difficult to realize a normally off transistor that does not allow conduction unless a voltage is applied to the gate.

A normally off operation is required of power supply circuits dealing with power of several hundred to one thousand volts from the viewpoint of safety. Thus, a circuit configuration that realizes a normally off operation by cascode-connecting a normally on GaN based transistor and a normally off Si transistor is proposed.

In an inverter circuit of a control system to which a motor as an inductive load is connected, a reflux current from the motor flows to a switching element when the switching element is turned off. If the above circuit configuration is applied to the switching element of an inverter circuit of a motor control system, a reflux current flows to a body diode of a normally off Si transistor. Due to inferior recovery characteristics of the body diode of the Si transistor, power loss of the inverter circuit may increase when the reflux current flows.

DETAILED DESCRIPTION

Figure 1:
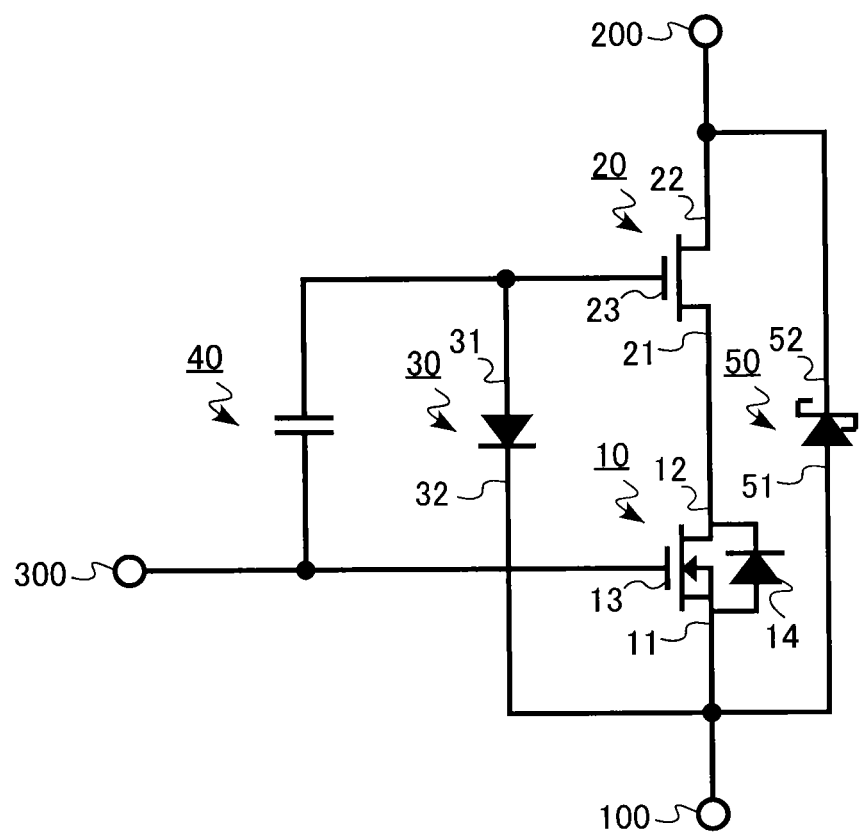
FIG. 1 is a circuit diagram of a semiconductor device according to a first embodiment.

A semiconductor device according to an embodiment includes a normally off transistor having a first source, a first drain, a first gate connected to a common gate terminal, and a body diode, a normally on transistor having a second source connected to the first drain, a second drain, and a second gate, a capacitor provided between the common gate terminal and the second gate, a first diode having a first anode connected to between the capacitor and the second gate and a first cathode connected to the first source, and a second diode having a second anode connected to the first source and a second cathode connected to the second drain.

The embodiments of the present disclosure will be described below with reference to the drawings. In the description that follows, the same reference numerals are attached to the same members and the description of members once described is omitted when appropriate.

In this specification, the semiconductor device is a power module in which a plurality of devices such as discrete semiconductors is combined, an intelligent power module in which a drive circuit to drive a plurality of devices such as discrete semiconductors and a self-protection function are incorporated into these devices, or a concept embracing the whole system including the power module or intelligent power module.

Also in this specification, the "GaN based semiconductor" is a generic name for semiconductors including GaN (gallium nitride), AlN (aluminum nitride), InN (indium nitride), or intermediate composition thereof.

(First Embodiment)

A semiconductor device according to the present embodiment includes a normally off transistor having a first source, a first drain, a first gate connected to a common gate terminal, and a body diode, a normally on transistor having a second source connected to the first drain, a second drain, and a second gate, a capacitor provided between the common gate terminal and the second gate, a first diode having a first anode connected to between the capacitor and the second gate and a first cathode connected to the first source, and a second diode having a second anode connected to the first source and a second cathode connected to the second drain.

FIG. 1 is a circuit diagram of a semiconductor device according to the present embodiment. The semiconductor device according to the present embodiment is, for example, a power module whose rated voltage is 600 V or 1200 V.

The semiconductor device according to the present embodiment constitutes a power module by connecting in series a normally off transistor 10 that does not allow conduction unless a voltage is applied to the gate and a normally on transistor 20 that allows conduction without a voltage being applied to the gate. The normally off transistor 10 is, for example, vertical MOSFET (Metal Oxide Semiconductor Field Effect Transistor) of Si (silicon). The normally on transistor 20 is, for example, HEMT of GaN (gallium nitride). The normally on transistor 20 includes, for example, a gate dielectric film.

The normally off transistor 10 has, when compared with the normally on transistor 20, a lower device breakdown voltage. The device breakdown voltage of the normally off transistor 10 is, for example, 10 V or more and 30 V or less. The device breakdown voltage of the normally on transistor 20 is, for example, 600 V or more and 1200 V or less.

The semiconductor device includes a source terminal 100, a drain terminal 200, and a common gate terminal 300. The normally off transistor 10 includes a first source 11 connected to the source terminal 100, a first drain 12, and a first gate 13 connected to the common gate terminal 300. The normally off transistor 10 also includes a body diode (parasitic diode) 14.

The normally on transistor 20 includes a second source 21 connected to the first drain 12, a second drain 22 connected to the drain terminal 200, and a second gate 23. However, the normally on transistor 20 does not include any body diode (parasitic diode).

The semiconductor device includes a capacitor 40 provided between the common gate terminal 300 and the second gate 23. The semiconductor device also includes a first diode 30 having a first anode 31 connected to between the capacitor 40 and the second gate 23 and a first cathode 32 connected to the first source 11. The first diode 30 is, for example, a PIN diode, a PN diode, a Zener diode, or a Schottky barrier diode. If the first diode 30 is a Zener diode, the Zener voltage is larger than the amplitude of the common gate terminal 300.

The semiconductor device includes a second diode 50 having a second anode 51 connected to the first source 11 and a second cathode 52 connected to the second drain 22. The second diode includes a function that passes a current from the source terminal 100 side to the drain terminal 200 side when the voltage of the source terminal 100 is higher than the voltage of the drain terminal 200. This is a so-called reflux diode.

The second diode 50 is desirably a diode superior in recovery characteristics. The second diode 50 desirably has a shorter recovery time than the recovery time of the body diode 14 of the normally off transistor 10. The second diode 50 is, for example, a Schottky barrier diode or a first recovery diode that is superior in recovery characteristics when compared with a PIN diode or a PN diode.

In addition, the second diode 50 is desirably a diode using a wide gap semiconductor having a wider band gap than Si. A diode using a wide gap semiconductor can realize a higher breakdown voltage than a diode using Si. Wide gap semiconductors include, for example, a GaN based semiconductor, SiC, and diamond.

With the above configuration, the semiconductor device according to the present embodiment functions as a normally off transistor including the source terminal 100, the drain terminal 200, and the common gate terminal 300.

Hereinafter, the operation of the semiconductor device according to the present embodiment will be described.

First, in an on state, 0 V is applied to the source terminal 100 and a positive voltage, for example, the product of the on resistance and a drain current is applied to the drain terminal 200. Then, a positive voltage, for example, 15 V is applied to the common gate terminal 300.

At this point, a positive voltage is applied to the first gate 13 of the normally off transistor 10. Thus, the normally off transistor 10 is turned on.

On the other hand, the second gate 23 of the normally on transistor 20 is clamped to the source terminal 100 via the first diode 30. Thus, the second gate 23 at positive voltage near 0 V, to be more precise, at forward drop voltage (Vf1) of the first diode 30. With the normally off transistor 10 turned on, the second source 21 is at potential near 0 V. Thus, a voltage equal to the threshold voltage of the normally on transistor 20 or more is applied to between the second source 21 and the second gate 23. Thus, the normally on transistor 20 is also turned on. Therefore, an on current flows between the source terminal 100 and the drain terminal 200.

Next, a case when the semiconductor device changes from an on state to an off state will be considered. In this case, the voltages applied to the source terminal 100 and the drain terminal 200 do not change and the voltage applied to the common gate terminal 300 from drops from the positive voltage to 0 V, for example, 15 V to 0 V.

First, 0 V is applied to the first gate 13 of the normally off transistor 10. Thus, the normally off transistor 10 is turned off.

On the other hand, the potential of the second gate 23 of the normally on transistor 20 drops by the amplitude of the common gate terminal 300 due to the presence of the capacitor 40. For example, the potential drops from the forward drop voltage (Vf1) of the first diode 30 by the amplitude of the common gate terminal 300, for example, by 15 V to become a negative potential of (Vf1-15) V. Then, the normally on transistor 20 is turned off after the drop of a potential difference between the second source 21 and the second gate 23 to the threshold voltage of the normally on transistor 20 or less. Therefore, the current between the source terminal 100 and the drain terminal 200 is cut off.

The semiconductor device according to the present embodiment operates as described above and functions as a normally off transistor including the source terminal 100, the drain terminal 200, and the common gate terminal 300.

Hereinafter, the function and effect of the semiconductor device according to the present embodiment will be described. The semiconductor device according to the present embodiment firstly has an effect of improving reliability by an overvoltage being inhibited. Secondly, the semiconductor device has an effect of improving recovery characteristics when a reflux current flows.

First, the effect of improving reliability of the semiconductor device according to the present embodiment will be described.

Figure 2:
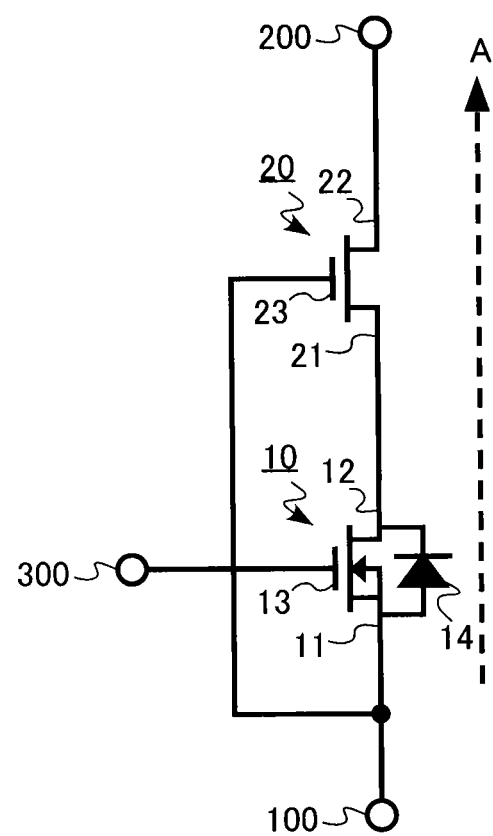
FIG. 2 is a circuit diagram of the semiconductor device according to a comparative example.

FIG. 2 is a circuit diagram of the semiconductor device according to a comparative example. The semiconductor device according to the comparative example has a circuit configuration in which the normally off transistor 10 and the normally on transistor 20 are cascode-connected. The normally off transistor 10 and the normally on transistor 20 are transistors similar to those in the present embodiment.

The semiconductor device includes the source terminal 100, the drain terminal 200, and the common gate terminal 300. The normally off transistor 10 includes the first source 11 connected to the source terminal 100, the first drain 12, and the first gate 13 connected to the common gate terminal 300. The normally on transistor 20 includes the second source 21 connected to the first drain 12, the second drain 22 connected to the drain terminal 200, and the second gate 23 connected to the source terminal 100.

With the above configuration, the semiconductor device according to the comparative example also functions as a normally off transistor including the source terminal 100, the drain terminal 200, and the common gate terminal 300.

In the circuit configuration according to the comparative example, an overvoltage may arise during device operation between the normally off transistor 10 and the normally on transistor 20, that is, in the first drain 12 and the second source 21 (hereinafter, also called a connection portion). The overvoltage arises when, for example, a transient current is generated during transition of the semiconductor device from the on state to the off state and a high voltage applied to between the source terminal 100 and the drain terminal 200 is divided according to the ratio of parasitic capacitance of the normally off transistor 10 and the normally on transistor 20.

In the case of the comparative example, when the transition from the on state to the off state occurs, the normally off transistor 10 is first turned off and then, the voltage of the connection portion rises and when the potential difference between the second gate 23 clamped to 0 V and the second source 21 reaches the threshold voltage thereof, the normally on transistor 20 is turned off. Therefore, if the potential of the connection portion rises due to a transient current, an overvoltage of the connection portion arises because there is no path to dissipate charges.

When an overvoltage arises, a high voltage is applied to between the second source 21 and the second gate 23 of the normally on transistor 20. If the high voltage rises to the breakdown voltage of the gate dielectric film or higher, a leak current of the gate dielectric film of the normally on transistor 20 may increase or the gate dielectric film may breakdown. If the leak current of the gate dielectric film of the normally on transistor 20 increases or the gate dielectric film breakdown, the semiconductor device does not operate normally. Therefore, reliability of the semiconductor device is degraded.

Even if the gate dielectric film is not damaged, charges may be trapped on the second source 21 side by a high voltage being applied to between the second source 21 and the second gate 23 of the normally on transistor 20. A current collapse may arise due to the trapping of charges. If a current collapse arises, the on current decreases, leading to an operation failure. Therefore, reliability of the semiconductor device is also degraded.

In the semiconductor device according to the present embodiment, on the other hand, the normally on transistor 20 is first turned off before the normally off transistor 10 during transition from the on state to the off state. This is because, in contrast to the comparative example, the second gate 23 of the normally on transistor 20 is controlled by a voltage applied to the common gate terminal 300.

With the normally on transistor 20 being turned off first, an overvoltage between the normally off transistor 10 and the normally on transistor 20, that is, in the first drain 12 and the second source 21 (connection portion) is inhibited from rising.

This is because, with the normally on transistor 20 being turned off first, charges can be dissipated to the source terminal 100 by the normally off transistor 10 turned on even if the potential of the connection portion rises due to a transient current.

In the present embodiment, as described above, charges can be dissipated to the source terminal 100 by the normally off transistor 10 turned on even if the potential of the connection portion rises due to a transient current. Thus, an overvoltage of the connection portion does not arise theoretically. Therefore, an increase of the leak current of the gate dielectric film in the normally on transistor 20 and breakdown of the gate dielectric film are prevented. In addition, a current collapse is prevented. Therefore, reliability of the semiconductor device is improved.

Also, by adopting a Zener diode as the first diode 30, an excessively negative voltage can be inhibited from being applied to the gate of the normally on transistor 20. For example, while the normally on transistor 20 is in an off state by a negative voltage being applied to the gate thereof, a negative voltage more than necessary can be inhibited from being applied by other voltage changes being transmitted by parasitic capacitance or the like.

Figure 3:
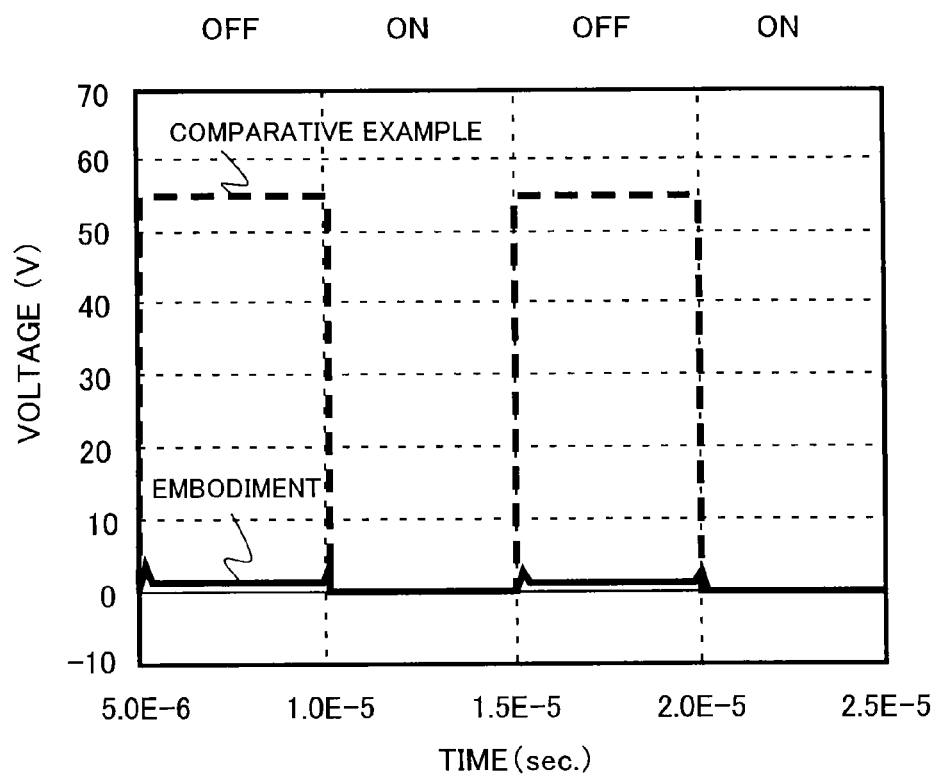
FIG. 3 is a diagram showing an effect of the semiconductor device according to the first embodiment.

FIG. 3 is a diagram showing an effect of the semiconductor device according to the present embodiment. FIG. 3 shows simulated results of voltage changes of the connection portion when an on-off operation is repeated in circuits in the present embodiment and the comparative example.

The solid line shows the case of the embodiment and the dotted line shows the case of the comparative example. It is clear that while a high overvoltage is generated in the connection portion during off state in the comparative example, an overvoltage is effectively inhibited in the embodiment.

Indeed, in the present embodiment, no voltage is directly applied to the second gate 23 of the normally on transistor 20 while the semiconductor device is turned off. Thus, there is a possibility that the voltage of the second gate 23 gradually rises from a negative voltage toward 0 V due to a gate leak current, a leak current of the diode 30 and the like.

If the voltage of the second gate 23 rises, a leak current between the second source 21 and the second drain 22 of the normally on transistor 20 also increases. Because the normally off transistor 10 remains off, the voltage of the second source 21 (first drain 12, connection portion) rises. Then, the potential difference between the second source 21 and the second gate increases and the normally on transistor 20 is turned on and a leak current between the second source 21 and the second drain is cut off. Therefore, the off state of the semiconductor device is maintained.

In the present embodiment, sheet resistance of a gate electrode material of the normally on transistor 20 is desirably lower than the sheet resistance of the normally off transistor 10. This is because it becomes easier to configure the normally on transistor 20 to turn off first before the normally off transistor 10 during transition from the on state to the off state.

Also, it is desirable to configure the normally off transistor 10 to turn on first before the normally on transistor 20 during transition from the off state to the on state. This is because if the normally on transistor 20 should be turned on first, a high voltage is applied to the first drain 12 (second source 21, connection portion), which could degrade characteristics of the normally off transistor 10.

The capacitance of the capacitor 40 is desirably 10 times or more of the input capacitance of the normally on transistor 20 and 100 times or less. A negative voltage applied to the second gate 23 of the normally on transistor 20 is determined by the ratio of the capacitance of the capacitor 40 and the input capacitance of the normally on transistor 20. Therefore, a larger capacitance of the capacitor 40 is desirable.

If the capacitance of the capacitor 40 is 10 times or more of the input capacitance of the normally on transistor 20, 90% or more of the amplitude applied to the common gate terminal 300 can be applied. If the capacitance of the capacitor 40 exceeds 100 times the input capacitance, the capacitor becomes too big and there is a cause for concern about an increase in size of the semiconductor device.

The input capacitance of the normally on transistor 20 is a capacitance between the second gate 23, and the second source 21 and the second drain 22. The input capacitance is defined as a value when the bias to the second source 21 and the second drain 22 is 0 V and the normally on transistor is in a pinch-off state.

Also in the present embodiment, in contrast to the comparative example, particularly the switching speed from on state to off state is determined by the normally on transistor 20 of GaN HEMT whose switching speed is fast. Therefore, a semiconductor device whose switching speed is fast can be realized.

It is also desirable to set the avalanche breakdown voltage of the normally off transistor 10 to a voltage lower than the breakdown voltage of the gate dielectric film of the normally on transistor 20. Accordingly, the breakdown voltage between the first source and the first drain while the normally off transistor is off is made lower than the breakdown voltage between the second source and the second gate of the normally on transistor.

Then, even if, for example, an overvoltage arises in the connection portion due to a surge or the like, charges in the connection portion can be dissipated by the avalanche breakdown occurring in the normally off transistor 10. Therefore, the voltage applied to between the second source 21 and the second gate 23 of the normally on transistor 20 can be made lower than the breakdown voltage of the gate dielectric film of the normally on transistor 20. Therefore, an increase of the leak current of the gate dielectric film in the normally on transistor 20 and breakdown of the gate dielectric film are prevented. In addition, a current collapse is prevented. Therefore, reliability of the semiconductor device is improved.

Incidentally, the breakdown voltage of the gate dielectric film of the normally on transistor 20 generally exceeds 30 V. Thus, the avalanche breakdown voltage of the normally off transistor 10 is desirably 30 V or less.

It is also desirable that the avalanche breakdown voltage be sufficiently higher than the absolute value of the threshold voltage (Vth) of the normally on transistor 20. This is intended to be able to reliably turn off the normally on transistor 20. From this viewpoint, the avalanche breakdown voltage of the normally off transistor 10 is desirably the absolute value of the threshold voltage (Vth) of the normally on transistor 20 plus 5 V or more. If Vth=−10 V, the avalanche breakdown voltage of the normally off transistor 10 is desirably 15 V or more.

Next, an improvement effect of recovery characteristics of the semiconductor device according to the present embodiment will be described.

In the semiconductor device in the comparative example shown in FIG. 2, if, for example, a reflux current when used as a switching element of an inverter circuit of a motor control system flows, that is, if a so-called reflux mode is set, the source terminal 100 side has a relatively positive voltage and the drain terminal 200 side has a relatively negative voltage. At this point, the normally on transistor 20 is in an on state. Then, the channel of the normally off transistor 10 is turned off and thus, the reflux current flows through the body diode 14 of the normally off transistor 10 in the forward direction (direction of a dotted arrow A in FIG. 2).

If the normally off transistor 10 is, for example, vertical MOSFET of Si (silicon), the body diode 14 is a PN diode. The PN diode is a bipolar device that allows a forward current to flow by conductivity modulation of minority carriers. Thus, the PN diode generally needs a longer recovery time and recovery characteristics thereof are inferior. Therefore, recovery characteristics of the semiconductor device in the comparative example are also inferior. Therefore, if, for example, the semiconductor device according to the comparative example is used as a switching element of an inverter circuit of a motor control system, a problem of increased switching losses in the reflux mode is posed.

Figure 4:
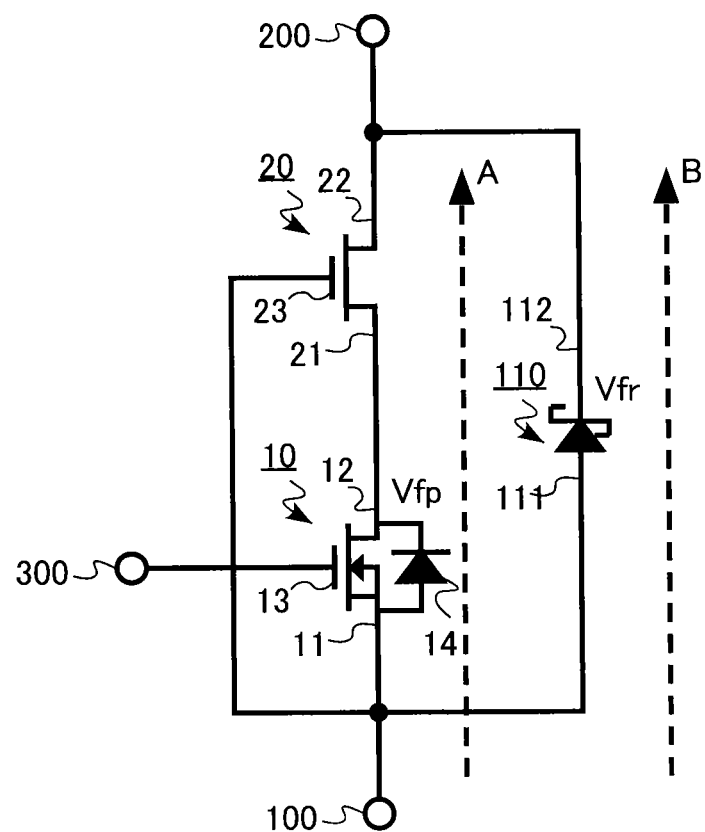
FIG. 4 is an explanatory view showing a function/effect of the semiconductor device according to the first embodiment.

FIG. 4 is an explanatory view showing a function/effect of the present embodiment. FIG. 4 shows a circuit diagram of comparative example in which a diode 110 is provided between the first source 11 and the second drain 22 in parallel with the normally off transistor 10 and the normally on transistor 20 as that of the present embodiment. An anode 111 of the diode 110 is connected to the first source 11 side and a cathode 112 is connected to the second drain 22 side.

For example, a case when a Schottky barrier diode or a first recovery diode that are superior in recovery characteristics is applied as the diode 110 is considered. In this case, two paths, a path (hereinafter, a current path A) indicated by a dotted arrow A in FIG. 4 and a path (hereinafter, a current path B) indicated by a dotted arrow B in FIG. 4, can be considered as the paths of a reflux current.

In this case, if, for example, the forward drop voltage (Vfr) of the diode 110 is made lower than the forward drop voltage (Vfp) of the body diode 14, a reflux current will begin to flow through the current path B via the diode 110.

However, the forward drop voltage (Vfr) of the diode 110 and the forward drop voltage (Vfp) of the body diode 14 are both in the range of about 0.3 to 1.5 V, which makes it difficult to increase a mutual voltage difference. Thus, the reflux current is shunted to the current path A in which the current flows through the body diode 14 and the current path B in which the current flows through the diode 110. Therefore, even if the diode 110 superior in recovery characteristics is provided, recovery characteristics of the semiconductor device may not be sufficiently improved.

In addition, due to, for example, differences of temperature characteristics between the body diode 14 and the diode 110, a change of a shunt current or so may arise, leading to unstable characteristics when the semiconductor device is in the reflux mode.

Figure 5:
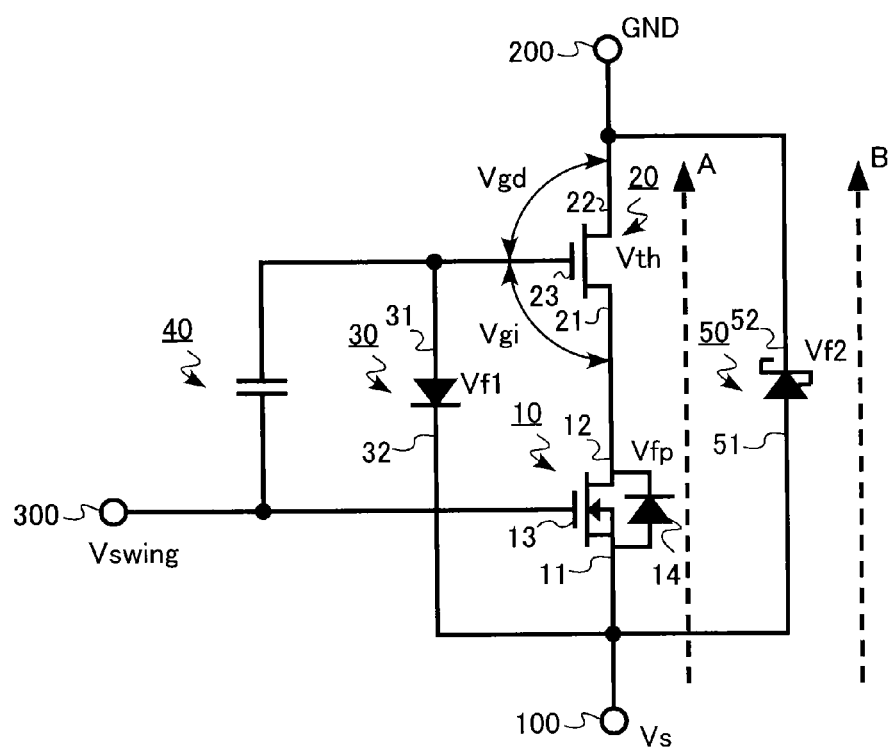
FIG. 5 is an explanatory view showing the function/effect of the semiconductor device according to the first embodiment.

FIG. 5 is an explanatory view showing the function/effect of the present embodiment. FIG. 5 shows a circuit diagram of the present embodiment.

In the semiconductor device according to the present embodiment, most of the reflux current flows through the current path B via the second diode 50 indicated by the dotted arrow B in FIG. 5 and almost no current flow through the current path A via the body diode 14 indicated by the dotted arrow A in FIG. 5.

Hereinafter, the operation of the semiconductor device according to the present embodiment in the reflux mode in which a reflux current flows will be described. It is assumed that the threshold voltage of the normally on transistor 20 is Vth, the amplitude of the voltage applied to the common gate terminal 300 is Vswing, the forward drop voltage of the first diode 30 is Vf1, the forward drop voltage of the second diode 50 is Vf2, and the forward drop voltage of the body diode 14 is Vfp. It is further assumed that the source voltage applied to the source terminal 100 in the reflux mode is Vs, the voltage difference between the second gate 23 and the second drain 22 of the normally on transistor 20 is Vgd, and the voltage difference between the second gate 23 and the second source 21 in an off state immediately entering the reflux mode is Vgi. In addition, the drain terminal 200 in the reflux mode is assumed to be the ground potential (0 V).

The potential of the second gate 23 of the normally on transistor 20 rises in the reflux mode due to coupling with rising Vs. Thus, the relation $$Vgd=Vs+Vgi \qquad \text{(Formula 1)}$$

holds. However, (Formula 1) ignores the forward drop voltage Vfp of the body diode 14.

For example, the time when Vs gradually rises after entering the reflux mode and reaches Vs=2 V is considered. If, for example, Vgi=−15 V, Vgd=Vs+Vgi=2 V+(−15 V)=−13 V is obtained from (Formula 1). Vgd also rises with rising Vs.

The normally on transistor 20 in the reflux mode is turned on when $$Vgd>Vth \qquad \text{(Formula 2)}.$$

Vgd=Vs+Vgi is obtained from (Formula 1) and thus, the normally on transistor 20 is turned on when $$Vs+Vgi>Vth \qquad \text{(Formula 3)}$$

is satisfied.

Vth of the normally on transistor 20 is a negative voltage. If, for example, Vth=−10 V, the normally on transistor 20 is not turned on when Vs=2 V. If Vgi=−15 V described above is assumed, the normally on transistor 20 is turned on when Vs=5 V is exceeded.

Vgi is set to a sufficiently low value when compared with Vth, in other words, a negative value whose absolute value is sufficiently larger than Vth of the normally on transistor 20 to stabilize the off state of the normally on transistor 20.

Therefore, in the semiconductor device according to the present embodiment, even if the source voltage Vs applied to the source terminal 100 exceeds the forward drop voltage (Vfp) of the body diode 14, the normally on transistor 20 is not turned on and no reflux current flows through the current path A unless the source voltage Vs exceeds a predetermined positive value determined by the relationship between the gate-source voltage Vgi in the off state of the normally on transistor 20 immediately before entering the reflux mode and Vth.

Vgi can be expressed by using Vswing and Vf1 as $$Vgi=Vf1-Vswing \qquad \text{(Formula 4)}.$$

Further, if the forward drop voltage Vfp of the body diode 14 is taken into consideration, the voltage drops by Vfp in the second source 21 and thus, (Formula 1) is changed to $$Vgd=Vs+Vgi-Vfp \qquad \text{(Formula 5)}.$$

From (Formula 2), (Formula 4), and (Formula 5), to be more exact, the normally on transistor 20 is turned on when Vs rises and $$Vs>Vth+Vswing-Vf1+Vfp \qquad \text{(Formula 6)}$$

is satisfied.

If, for example, Vth=−10V, Vswing=15V, Vf1=0.7V, and Vfp=0.7V, the normally on transistor 20 is turned on in the range of Vs>5 V. Thus, a reflux current flows through the current path A indicated by the dotted arrow A in FIG. 5 in the range in which (Formula 6) is satisfied. The above discussion is a discussion about the operation of a circuit in which the second diode 50 is not provided or a circuit assumed not to allow a current to flow to the second diode.

When the second diode 50 is provided, to cause a reflux current to first flow to the current path B via the second diode 50 indicated by the dotted arrow B in FIG. 5 before to the current path A indicated by the dotted arrow A in FIG. 5, it is only necessary that the forward drop voltage (Vf2) of the second diode 50 be lower than the voltage at which current starts flowing through the current path B. Thus, from (Formula 6), only the relationship of $$Vth+Vswing-Vf1+Vfp>Vf2 \qquad \text{(Formula 7)}$$

needs to be satisfied.

Figure 6:
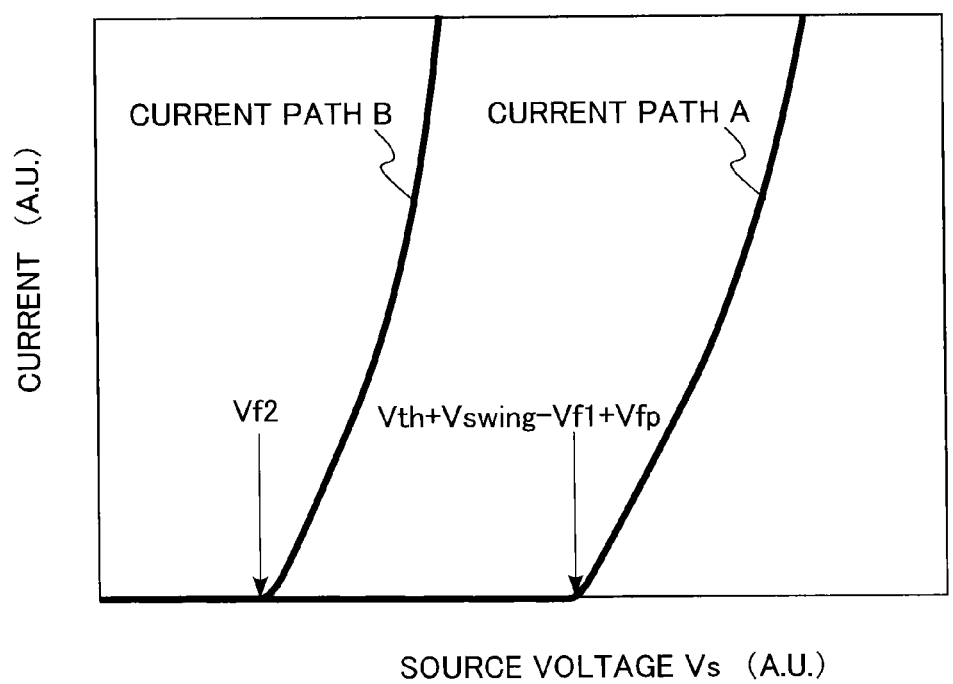
FIG. 6 is an explanatory view showing the function/effect of the semiconductor device according to the first embodiment.

FIG. 6 is an explanatory view showing the function/effect of the present embodiment. FIG. 6 schematically shows voltage-current characteristics of the current path A and the current path B in a circuit according to the present embodiment. The horizontal axis represents the positive voltage Vs applied to the source terminal 100 in the reflux mode.

As is conceptually evident also from FIG. 6, the on voltage of the current path A becomes larger than the on voltage of the current path B by satisfying (Formula 7) and the current path B becomes the main path.

The startup voltage of the current path A can be shifted to the high-voltage side by, for example, increasing Vswing as the amplitude of the voltage applied to the common gate terminal 300 that can be set to any value. If Vswing is selected appropriately, a shunt current to the current path A can be reduced to zero. Therefore, according to the semiconductor device in the present embodiment, a shunt current of a reflux current to the current path A can easily be inhibited.

A diode superior in recovery characteristics with a shorter recovery time than that of the body diode 14 is used for the second diode 50. Thus, according to the present embodiment, a semiconductor device whose recovery characteristics when a reflux current flows are improved is realized. Therefore, if, for example, the semiconductor device according to the present embodiment is used as a switching element of an inverter circuit of a motor control system, switching losses in the reflux mode can be inhibited.

In addition, the shunt current is inhibited and therefore, characteristics in the reflux mode can be inhibited from becoming instable even if the temperature environment or the like changes.

Compared with the current path A, the on resistance of the current path B that allows a reflux current to flow is low. Therefore, when compared with the comparative example, conduction losses in the reflux mode can be reduced.

According to the present embodiment, as described above, a semiconductor device whose reliability is improved and whose recovery characteristics are improved is realized.

(Second Embodiment)

The semiconductor device according to the present embodiment is the same as in the first embodiment except that a plurality of the first diodes is connected in series. Thus, the description of content overlapping with the content in the first embodiment is omitted.

Figure 7:
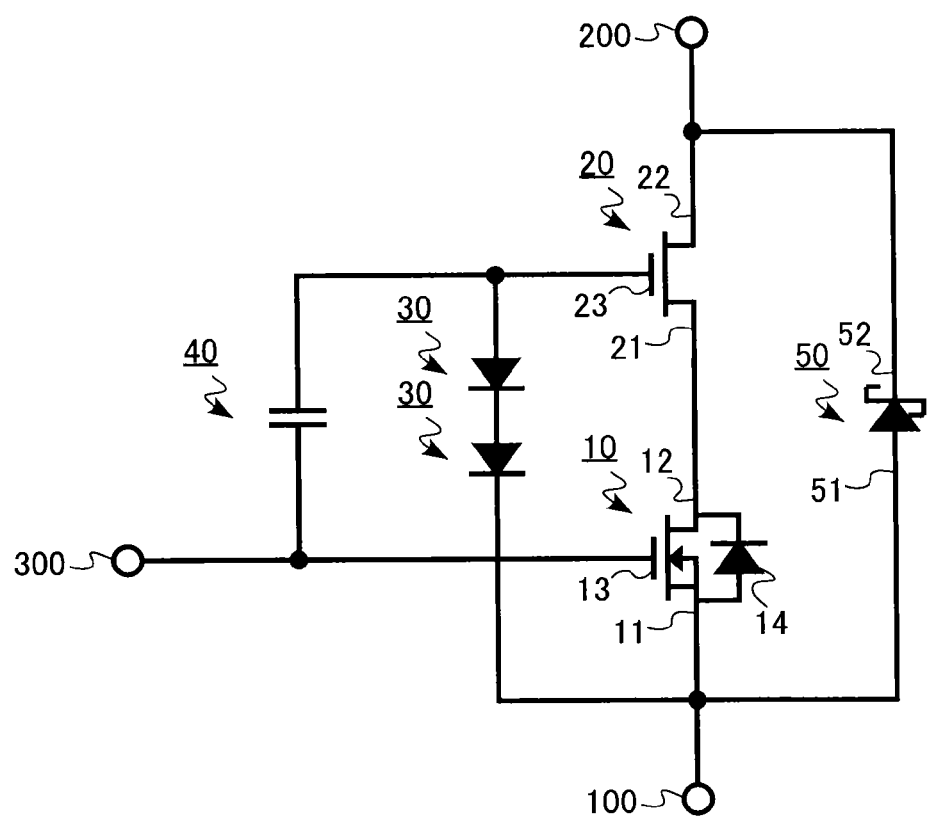
FIG. 7 is a circuit diagram of the semiconductor device according to a second embodiment.

FIG. 7 is a circuit diagram of the semiconductor device according to the present embodiment. In the semiconductor device according to the present embodiment, the two first diodes 30 are connected in series.

According to the present embodiment, the voltage of 2×the forward drop voltage (Vf) of the first diode 30 is applied to the second gate 23 while the semiconductor device is turned on. Therefore, the normally on transistor 20 can be overdriven and the on current can be increased.

In addition, even if the voltage of the second source 21 rises by the drain current×on resistance of the normally off transistor 10 while the semiconductor device is turned on, conduction losses can be inhibited by the voltage of 2×the forward drop voltage (Vf) of the first diode 30 being applied to the second gate 23.

Here, a case when the two first diodes 30 are connected in series is taken as an example, but the number of the first diodes 30 connected in series may be three or more. If the number thereof is n (n is an integer equal to 2 or greater), the voltage of n×the forward drop voltage (Vf) of the first diode 30 is applied to the second gate 23.

According to the present embodiment, in addition to the effect of the first embodiment, an increase of the on current or the reduction of conduction losses can be realized.

(Third Embodiment)

The semiconductor device according to the present embodiment is the same as in the first embodiment except that a first resistance element whose one end is connected to between the common gate terminal and the capacitor and the other end is connected to the first gate is further included. Thus, the description of content overlapping with the content in the first embodiment is omitted.

Figure 8:
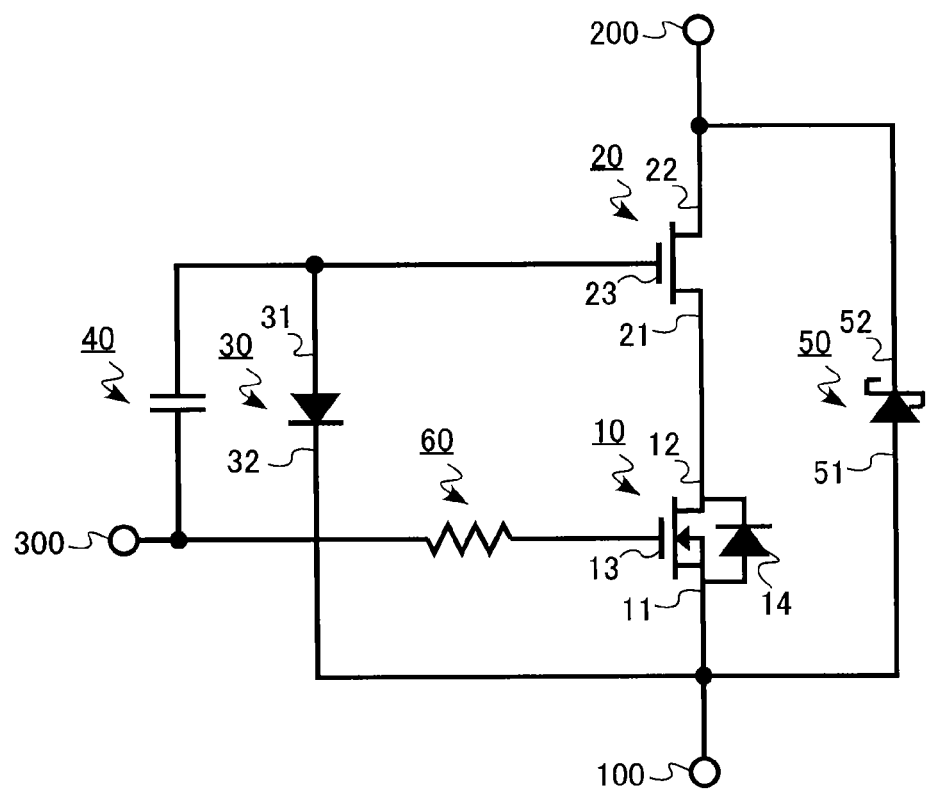
FIG. 8 is a circuit diagram of the semiconductor device according to a third embodiment.

FIG. 8 is a circuit diagram of the semiconductor device according to the present embodiment.

The semiconductor device according to the present embodiment includes a first resistance element 60 whose one end is connected to between the common gate terminal 300 and the capacitor 40 and the other end is connected to the first gate 13.

From the viewpoint of inhibiting an overvoltage of the connection portion, the normally on transistor 20 is first turned off before the normally off transistor 10 during transition from the on state to the off state. By providing the first resistance element 60, the off timing of the normally off transistor 10 and the off timing of the normally on transistor 20 can be delayed by a desired time.

The resistance of the first resistance element 60 is desirably 1Ω or more and 100Ω or less. If the resistance falls short of this range, a significant delay time may not be achieved. If the resistance exceeds this range, the delay time undesirably becomes too long and the switching speed of the semiconductor device shows down.

According to the present embodiment, in addition to the effect of the first embodiment, a stable operation can be obtained by adjusting the off timing of the normally off transistor 10 and the normally on transistor 20.

(Fourth Embodiment)

The semiconductor device according to the present embodiment is the same as in the third embodiment except that a third diode having a third anode connected to the common gate terminal and a third cathode connected to the first gate and provided between the common gate terminal and the first gate in parallel with the first resistance element is further included. Thus, the description of content overlapping with the content in the first and third embodiments is omitted.

Figure 9:
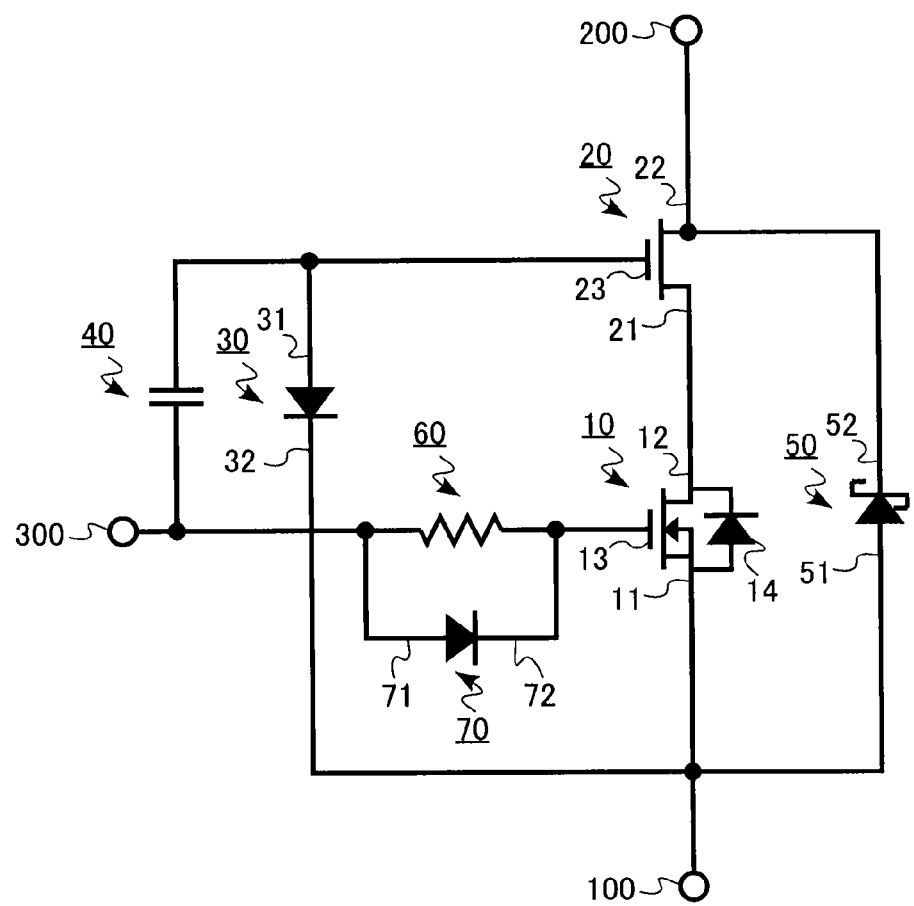
FIG. 9 is a circuit diagram of the semiconductor device according to a fourth embodiment.

FIG. 9 is a circuit diagram of the semiconductor device according to the present embodiment.

The semiconductor device according to the present embodiment is provided with a third diode 70 between the common gate terminal 300 and the first gate 13 in parallel with the first resistance element 60. A third anode 71 of the third diode 70 is connected to the common gate terminal 300 and a third cathode 72 is connected to the first gate 13. The third diode 70 is, for example, a PIN diode, a PN diode, or a Schottky barrier diode.

It is desirable that the normally off transistor 10 be turned on first before the normally on transistor 20 during transition from the off state to the on state. This is because if the normally on transistor 20 should be turned on first, a high voltage is applied to the first drain 12 (second source 21, connection portion), which could degrade characteristics of the normally off transistor 10.

According to the present embodiment, a current flows through the third diode 70 during transition from the off state to the on state. Thus, switching of the first gate 13 is not affected by the first resistance element 60 and the first gate 13 can swiftly be charged. Therefore, the on timing of the normally off transistor 10 is earlier than when the third diode 70 is not present. Therefore, the normally off transistor 10 can reliably be turned on first before the normally on transistor 20 during transition from the off state to the on state.

According to the present embodiment, in addition to the effect of the third embodiment, the protection of the normally off transistor 10 is reinforced and reliability thereof is further improved.

In addition, the gate voltage of the normally off transistor 10 during switching operation can be maintained at a level equal to the threshold voltage of the transistor or higher by adjusting the resistance of the first resistance element 60. Thus, the normally off transistor 10 can always be maintained in the on state. In this manner, charges needed for driving the gate of the normally off transistor 10 is reduced so that power consumption of the driving circuit can be reduced.

The normally off transistor 10 is always in the on state during switching operation and thus, the whole circuit is equal to, as an equivalent circuit, to a single operation of the normally on transistor 20. Thus, even if the potential of the drain terminal 200 drops while the normally on transistor 20 is turned off and a displacement current flows via the parasitic capacitance of the normally on transistor 20, the displacement current will not flow to the body diode of the normally off transistor. Accordingly, when a circuit like a resonance circuit, for example, an LLC resonance circuit using energy stored in the parasitic capacitance of a transistor is used, something like losses for a voltage drop after a displacement current flows to the body diode of the normally off transistor 10 is suitably not caused. In addition, the voltage between the drain and the source of the normally off transistor 10 is approximately the same and the normally on transistor 20 can be turned off regardless of potentials thereof and therefore, the source voltage of the normally on transistor 20 by the displacement current is stabilized and a decrease of self turn-off and the like is inhibited.

(Fifth Embodiment)

The semiconductor device according to the present embodiment is the same as in the fourth embodiment except that a second resistance element provided between the common gate terminal, and the capacitor and the first gate is further included. Thus, the description of content overlapping with the content in the fourth embodiment is omitted.

Figure 10:
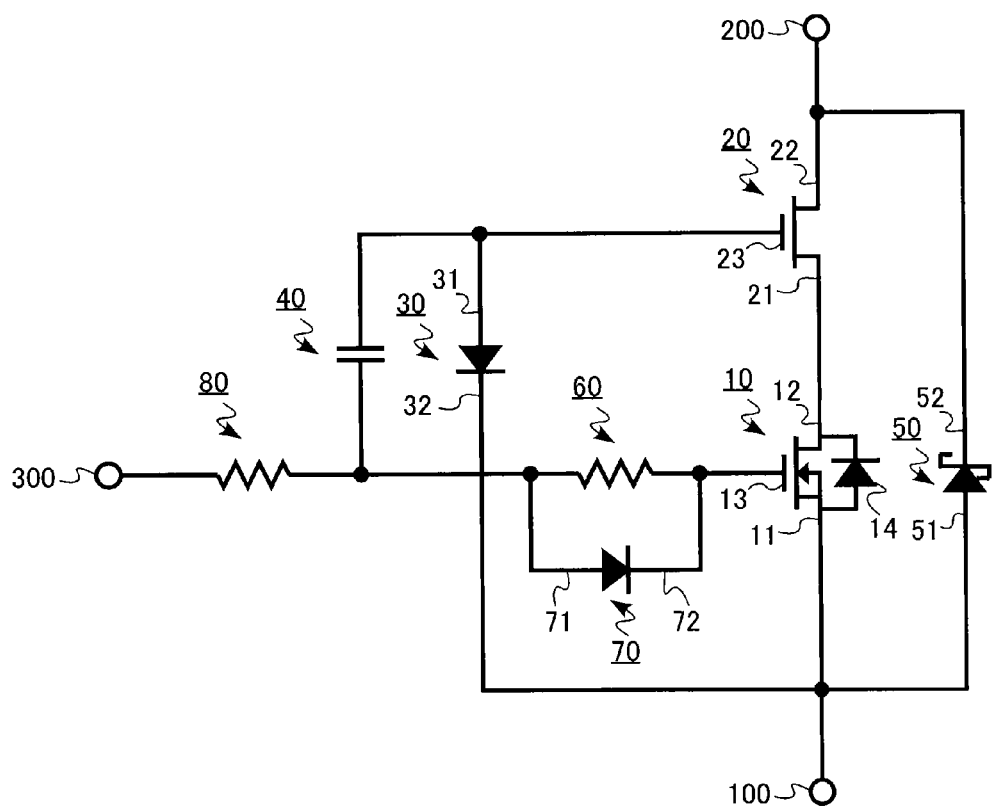
FIG. 10 is a circuit diagram of the semiconductor device according to a fifth embodiment.

FIG. 10 is a circuit diagram of the semiconductor device according to the present embodiment.

The semiconductor device according to the present embodiment includes a second resistance element 80 provided between the common gate terminal 300, and the capacitor 40 and the first gate 13.

In the circuit design of power electronics, adjustments of the working speed of transistors may be demanded for anti-noise measures. In the present embodiment, the propagation of the gate voltage applied to the common gate terminal 300 to the first gate 13 and the second gate 23 can be delayed by providing the second resistance element 80. Therefore, the working speed (switching speed) of the semiconductor device can be adjusted.

Here, cases when the first resistance element 60 or the third diode 70 is included are taken as examples, but a circuit configuration without the first resistance element 60 and the third diode 70 can also be adopted.

According to the present embodiment, in addition to the effect of the fourth embodiment, the working speed (switching speed) of the semiconductor device can be adjusted.

(Sixth Embodiment)

The semiconductor device according to the present embodiment is the same as in the fourth embodiment except that a third resistance element provided between the capacitor and the second gate is further included. Thus, the description of content overlapping with the content in the fourth embodiment is omitted.

Figure 11:
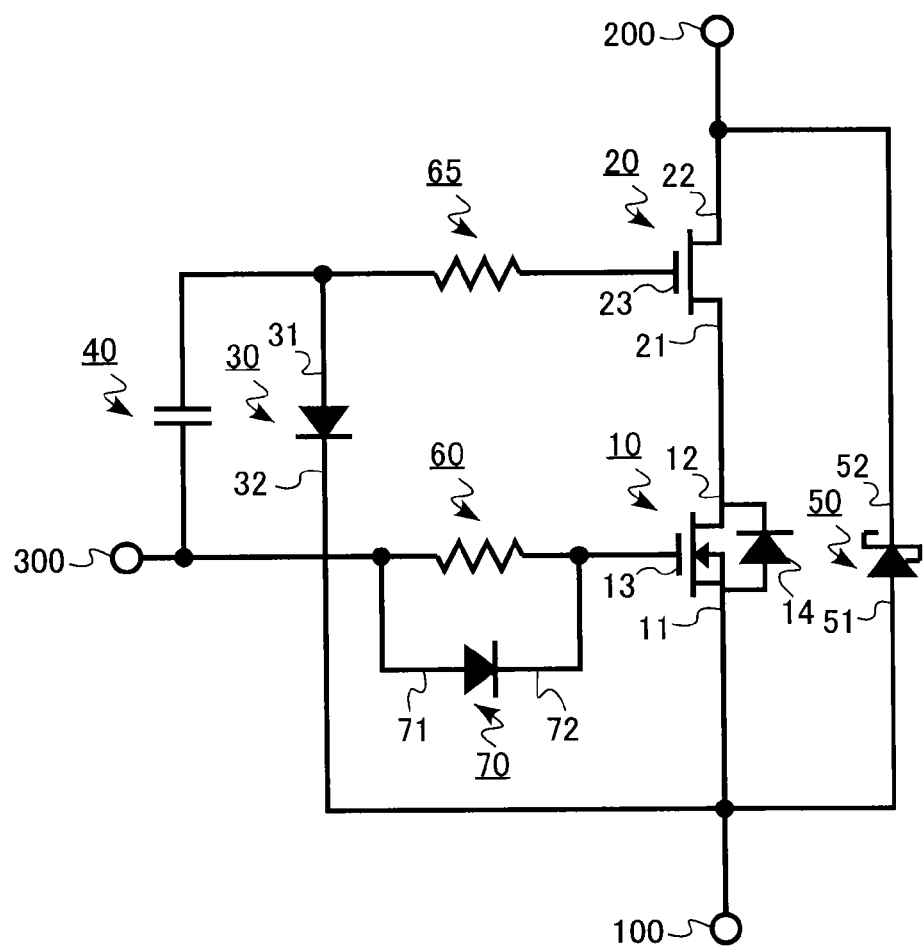
FIG. 11 is a circuit diagram of the semiconductor device according to a sixth embodiment.

FIG. 11 is a circuit diagram of the semiconductor device according to the present embodiment.

The semiconductor device according to the present embodiment includes a third resistance element 65 between the capacitor 40 and the second gate 23. The first anode 31 of the first diode 30 is connected to between the capacitor 40 and the third resistance element 65.

In the circuit design of power electronics, as described above, adjustments of the working speed of transistors may be demanded for anti-noise measures. In the present embodiment, the propagation of the gate voltage applied to the common gate terminal 300 to the second gate 23 can be delayed by providing the third resistance element 65. The propagation of the gate voltage to the first gate 13 can independently be adjusted by the resistance of the first resistance element 60. Therefore, the working speed (switching speed) of the semiconductor device can be adjusted.

According to the present embodiment, in addition to the effect of the fourth embodiment, the working speed (switching speed) of the semiconductor device can be adjusted.

(Seventh Embodiment)

The semiconductor device according to the present embodiment is the same as in the first embodiment except that a Zener diode having a fourth anode connected to the first source and a fourth cathode connected to the first drain and the second source, whose Zener voltage is lower than a breakdown voltage between the second source and the second gate of the normally on transistor, and whose Zener voltage is lower than the avalanche breakdown voltage of the normally off transistor is further included. Thus, the description of content overlapping with the content in the first embodiment is omitted.

Figure 12:
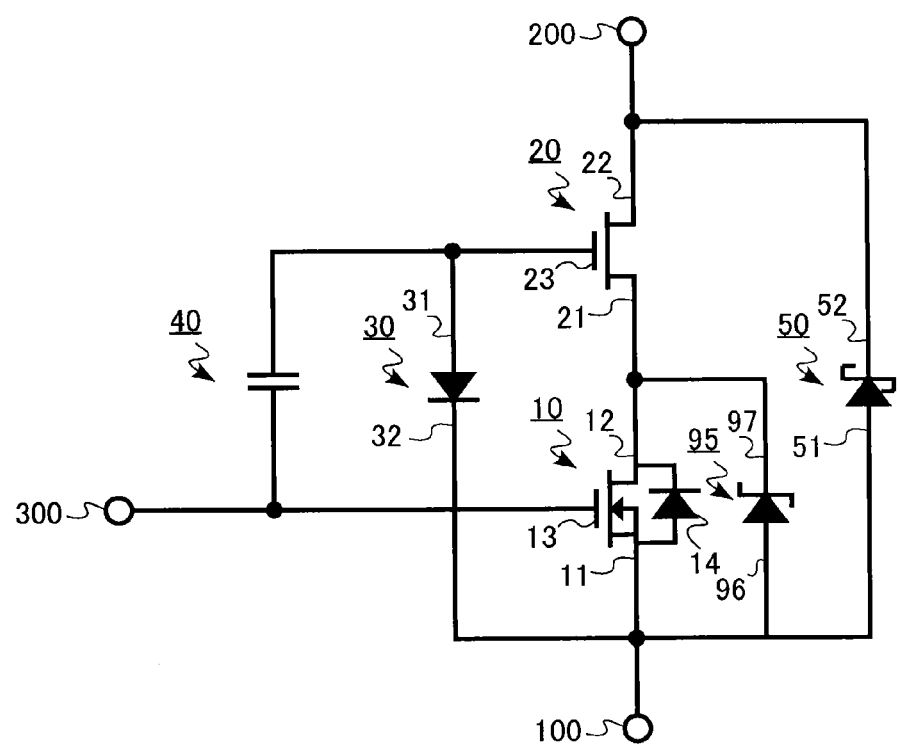
FIG. 12 is a circuit diagram of the semiconductor device according to a seventh embodiment.

FIG. 12 is a circuit diagram of the semiconductor device according to the present embodiment. The semiconductor device according to the present embodiment is provided with a Zener diode 95 in parallel with the normally off transistor 10.

The Zener diode 95 includes a fourth anode 96 and a fourth cathode 97. The fourth anode 96 is connected to the first source 11. The fourth cathode 97 is connected to the first drain 12 and the second source 21.

The Zener voltage of the Zener diode 95 is set so as to be lower than the avalanche breakdown voltage of the normally off transistor 10. Also, the Zener voltage is set so as to be lower than the breakdown voltage of a gate dielectric film of the normally on transistor 20.

In the semiconductor device according to the present embodiment, if an overvoltage arises in the connection portion of the normally off transistor 10 and the normally on transistor 20 due to a surge or the like, charges are dissipated to the Zener diode 95 to move to the source terminal 100 when the overvoltage reaches the Zener voltage. Thus, the voltage rise of the connection portion is inhibited and therefore, an increase of the leak current of the gate dielectric film in the normally on transistor 20 and breakdown of the gate dielectric film are prevented. In addition, a current collapse is prevented. Therefore, reliability of the semiconductor device is improved.

The Zener voltage of the Zener diode 95 can be controlled more precisely than the avalanche breakdown voltage of the normally off transistor 10. In the semiconductor device according to the present embodiment, therefore, an overvoltage of the connection portion can be inhibited in a more stable manner by using the Zener diode 95. Also, even if an unexpected high voltage such as noise is applied to the first drain 12 of the normally off transistor 10, charges can be dissipated by the Zener diode 95, contributing to the protection of the normally off transistor 10. Incidentally, a similar effect can be obtained by connecting the anode of the Zener diode 95 to the gate of the normally on transistor 20.

(Eighth Embodiment)

The semiconductor device according to the present embodiment includes a substrate, a lead wire of a source, a lead wire of a drain, and a lead wire of a gate. The normally off transistor, the normally on transistor, the capacitor, the first diode, and the second diode are mounted on the substrate, the normally off transistor and the normally on transistor are disposed from the lead wire side of the source toward the lead wire side of the drain in this order, the lead wire of the source and the first source, the first cathode, and the second anode are connected, and the lead wire of the drain, and the second drain and the first cathode are connected.

The present embodiment is a form embodying a circuit configuration including elements of the fifth and seventh embodiments as a power module. Hereinafter, the description of content overlapping with the content in the fifth or seventh embodiment is omitted.

Figure 13:
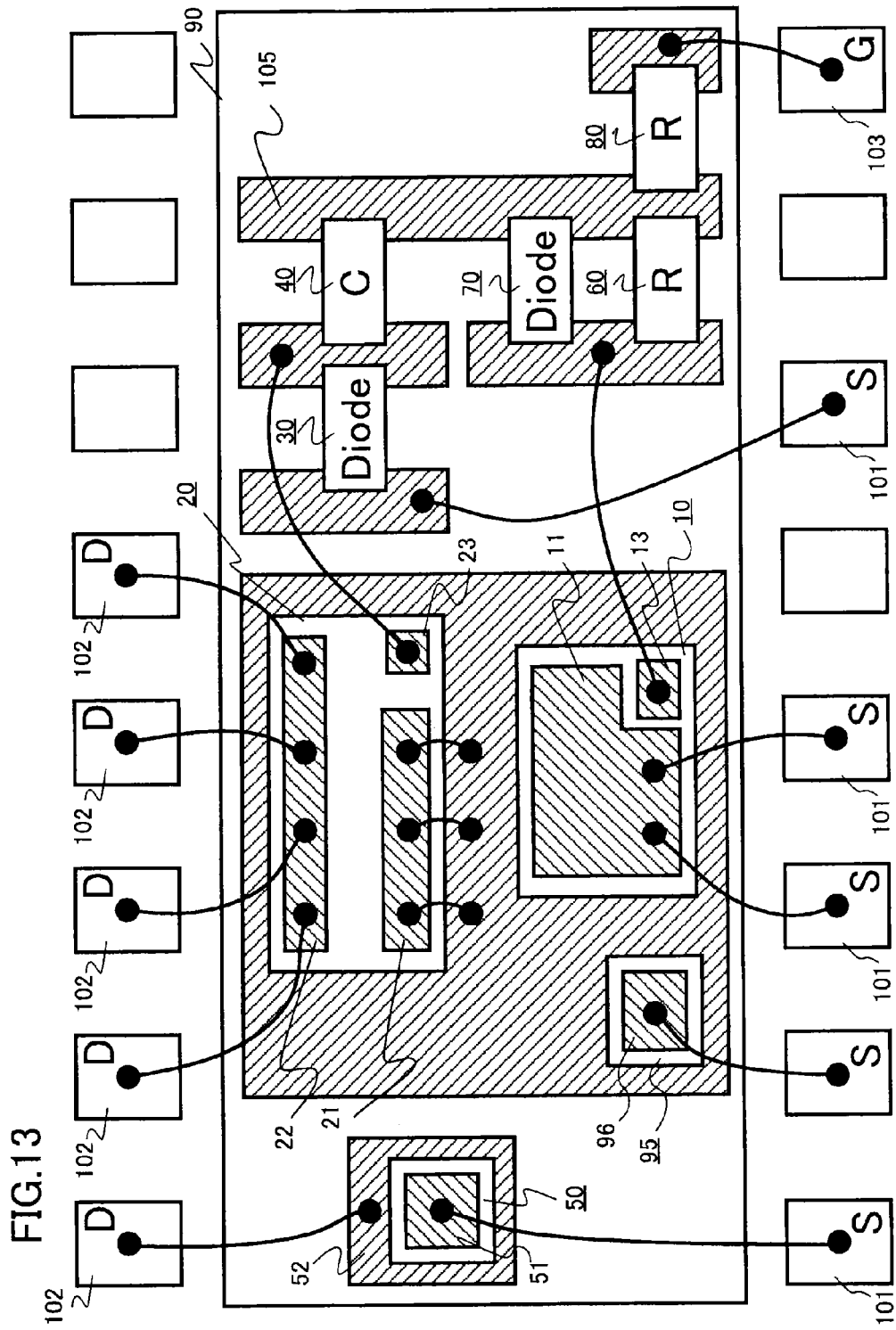
FIG. 13 is a schematic top view of the semiconductor device according to an eighth embodiment.

FIG. 13 is a schematic top view of the semiconductor device according to the present embodiment.

The semiconductor device according to the present embodiment includes a substrate 90, a lead wire 101 of the source, a lead wire 102 of the drain, and a lead wire 103 of the gate. The lead wire 101 of the source corresponds to the source terminal 100, the lead wire 102 of the drain corresponds to the drain terminal 200, and the lead wire 103 of the gate corresponds to the common gate terminal 300.

A conductive material 105 of metal is present at least on the surface of the substrate 90. The normally off transistor 10, the normally on transistor 20, the second diode 50, and the Zener diode 95 are mounted on the substrate 90. The normally off transistor 10, the normally on transistor 20, the second diode 50, and the Zener diode 95 are, for example, semiconductor chips and mounted on the conductive material 105 of the substrate by, for example, conductive paste or solder.

Also on the substrate 90, the capacitor 40, the first diode 30, the first resistance element 60, the second resistance element 80, and the third diode 70 are mounted on the conductive material 105 via solder.

Then, the Zener diode 95 and the normally on transistor 20 are disposed from the side of the lead wire 101 of the source toward the side of the lead wire 102 of the drain in this order. Also, the normally off transistor 10 and the normally on transistor 20 are disposed from the side of the lead wire 101 of the source of the substrate 90 toward the side of the lead wire 102 of the drain in this order.

Then, the lead wire 101 of the source, the second anode 51, the fourth anode 96, and the first source 11 are connected and the lead wire 102 of the drain, the second cathode 52, and the second drain 22 are connected. Each connection is performed by, for example, wire bonding. For the wire bonding, the material of, for example, copper (Cu), aluminum (Al) or the like is used.

According to the present embodiment, the normally off transistor 10 and the normally on transistor 20 are disposed from the side of the lead wire 101 of the source toward the side of the lead wire 102 of the drain in this order. Accordingly, the path through which the on current of the semiconductor device flows can be shortened. Due to the above disposition, parasitic inductance of the path of the on current is eliminated as much as possible, reducing conduction losses.

According to the present embodiment, as described above, in addition to the effect of the fifth and seventh embodiments, a semiconductor device superior in characteristics can be realized by appropriately disposing and connecting each device.

A case when all components of the fifth and seventh embodiments are included is taken as an example, but only necessary components may be selected from the fifth and seventh embodiments and packaged.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a normally off transistor including a first source, a first drain, a first gate connected to a common gate terminal, and a body diode;
   a normally on transistor including a second source connected to the first drain, a second drain, and a second gate;
   a capacitor provided between the common gate terminal and the second gate;
   a first diode including a first anode connected to a portion between the capacitor and the second gate and a first cathode connected to the first source; and
   a second diode including a second anode connected to the first source and a second cathode connected to the second drain;
   a first resistance element whose one end is connected to between the common gate terminal and the capacitor and whose other end is connected to the first gate; and
   a third diode including a third anode connected to the common gate terminal and a third cathode connected to the first gate and provided between the common gate terminal and the first gate in parallel with the first resistance element.

2. The device according to claim 1, wherein the normally on transistor is GaN HEMT.

3. The device according to claim 1, wherein the second diode has a shorter recovery time than the body diode.

4. The device according to claim 1, wherein the second diode is a Schottky barrier diode.

5. The device according to claim 1, wherein when a threshold voltage of the normally on transistor is Vth, an amplitude of a voltage applied to the common gate terminal is Vswing, a forward drop voltage of the first diode is Vf1, the forward drop voltage of the second diode is Vf2, and the forward drop voltage of the body diode is Vfp, a relationship of $$Vth+Vswing-Vf1+Vfp>Vf2$$

is satisfied.

6. The device according to claim 1, wherein the second diode is a diode using a wide gap semiconductor.

7. The device according to claim 1, wherein the normally off transistor is vertical MOSFET of Si (silicon).

8. The device according to claim 1, further comprising:
   a second resistance element provided between the common gate terminal, and the capacitor and the first gate.

9. The device according to claim 1, further comprising:
   a third resistance element provided between the capacitor and the second gate, wherein the first anode is connected to between the capacitor and the third resistance element.

10. The device according to claim 1, wherein a capacitance of the capacitor is 10 times or more of an input capacitance of the normally on transistor.

11. The device according to claim 1, further comprising:
    a Zener diode including a fourth anode connected to the first source and a fourth cathode connected to the first drain, a Zener voltage of the Zener diode being lower than a breakdown voltage between the second source and the second gate of the normally on transistor, and the Zener voltage is lower than an avalanche breakdown voltage of the normally off transistor.

12. The device according to claim 1, further comprising:
    a substrate, a lead wire of a source, a lead wire of a drain, and a lead wire of a gate, wherein
    the normally off transistor, the normally on transistor, the capacitor, the first diode, and the second diode are mounted on the substrate,
    the normally off transistor and the normally on transistor are disposed from a lead wire side of the source toward the lead wire side of the drain in this order,
    the lead wire of the source and the first source, the first cathode, and the second anode are connected,
    and the lead wire of the drain, and the second drain and the second cathode are connected.

* * * * *